United States Patent
Choi et al.

(10) Patent No.: US 6,930,013 B2
(45) Date of Patent: Aug. 16, 2005

(54) METHOD OF FORMING A CAPACITOR OF AN INTEGRATED CIRCUIT DEVICE

(75) Inventors: Sung-Je Choi, Seoul (KR); Han-Jin Lim, Seoul (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 23 days.

(21) Appl. No.: 10/156,987

(22) Filed: May 28, 2002

(65) Prior Publication Data

US 2002/0182820 A1 Dec. 5, 2002

(30) Foreign Application Priority Data

May 29, 2001 (KR) ........................................ 2001-29752

(51) Int. Cl.⁷ ...................... H01L 21/20; H01L 21/4763
(52) U.S. Cl. ...................................... 438/396; 438/627
(58) Field of Search .............................. 438/396, 627, 438/643, 778, 785; 117/104

(56) References Cited

U.S. PATENT DOCUMENTS

| | | | | |
|---|---|---|---|---|
| 4,389,973 A | * | 6/1983 | Suntola ...................... | 118/725 |
| 5,316,982 A | * | 5/1994 | Taniguchi ................... | 437/236 |
| 5,916,365 A | * | 6/1999 | Sherman ...................... | 117/92 |
| 6,103,567 A | * | 8/2000 | Shih et al. .................. | 438/251 |
| 6,200,847 B1 | * | 3/2001 | Kishiro ....................... | 438/240 |
| 6,203,613 B1 | * | 3/2001 | Gates et al. ................. | 117/104 |
| 6,399,491 B2 | * | 6/2002 | Joen et al. .................. | 438/680 |
| 6,509,280 B2 | * | 1/2003 | Choi .......................... | 438/778 |
| 2002/0031618 A1 | * | 3/2002 | Sherman ...................... | 427/569 |
| 2002/0081844 A1 | * | 6/2002 | Jeon et al. .................. | 438/680 |
| 2002/0110991 A1 | * | 8/2002 | Li ............................. | 438/347 |
| 2003/0003230 A1 | * | 1/2003 | Kim et al. ............. | 427/255.394 |

FOREIGN PATENT DOCUMENTS

KR 0056446 7/2001

OTHER PUBLICATIONS

Y. Kim et al Substrate Dependence on the Optical Properties of Al2O3 Films Grown by Atomic Layer Deposition Applied Phisics Letters, 71 (25) Dec. 1997 American Institute of Physics pp. 3604–3606.*

* cited by examiner

Primary Examiner—David S. Blum
(74) Attorney, Agent, or Firm—F. Chau & Associates, LLC

(57) ABSTRACT

A method of forming a capacitor having a lower electrode, an upper electrode, and a dielectric layer of an integrated circuit device is provided. A metal compound is adsorbed on the lower electrode by using a gaseous metal compound. A physisorbed metal compound on the lower electrode is purged by using an inert gas. The metal compound adsorbed on the lower electrode is oxidized with an oxidation gas to form a metal oxide. A gaseous product formed by oxidizing the metal compound is purged. Above steps are repeated to form a diffusion barrier layer of the metal oxide. The dielectric layer is formed of $Ta_2O_5$ on the diffusion barrier layer. A heat treatment is performed for the dielectric layer comprised of $Ta_2O_5$ under oxidation atmosphere. The steps are performed in a single atomic layer deposition chamber.

18 Claims, 9 Drawing Sheets

FIG. 9

| LAYER | DIELECTRIC CONSTANT($\varepsilon$) | TOXEQ( Å ) |
|---|---|---|
| SiO2 5Å | ~4 | 5 |
| Al2O3 30Å | ~10 | 12 |
| Ta2O5 50Å | ~26 | 8 |
| TOTAL | | 25 |

METHOD OF FORMING A CAPACITOR OF AN INTEGRATED CIRCUIT DEVICE

BACKGROUND OF THE INVENTION

1. Field of the Invention

The present invention relates to a method of forming a capacitor of an integrated circuit device, and more particularly, to a method of forming a capacitor of an integrated circuit device having a diffusion barrier layer formed of an $Al_2O_3$ layer in a single atomic layer deposition method and a dielectric layer formed of a $Ta_2O_5$ layer on the diffusion barrier layer.

2. Description of the Related Art

As the degree of integration of semiconductor memory devices such as dynamic random access memory (DRAM) increases, the size of each cell area is decreased, but all components needed to perform the functions of each cell must still fit within the reduced cell area. Accordingly, efforts have been made to increase a cell capacitance in a given cell area.

As is well known to those skilled in the art, there are various methods to increase the cell capacitance, such as increasing the effective area of a capacitor, reducing the thickness of a dielectric layer, and increasing the dielectric constant of the dielectric layer.

Recently, a metal oxide layer such as aluminum oxide and tantalum oxide ($Ta_2O_5$) is used as the dielectric layer instead of the conventional dielectric layer such as a silicon oxide layer or a nitride layer. The advantage in using a dielectric layer consisting of $Ta_2O_5$ is because of its higher dielectric constant of about 26.

However, a surface of the tantalum oxide layer is easily reduced to a tantalum rich phase, thereby being unstable in the surface of the tantalum layer. And a $SiO_2$ layer is easily formed before or after depositing the tantalum oxide layer at the interface between the tantalum oxide layer and the polysilicon layer provided as a storage electrode and a plate electrode. To reduce unstable characteristics, a rapid thermal nitridation is performed on the storage electrode formed of the polysilicon layer to form a nitride layer comprised of $Si_3N_4$ before depositing the tantalum oxide layer, thereby preventing forming the oxidation of the polysilicon layer.

However, if the nitride layer is formed non-uniformly or the growth of the nitride layer is insufficient due to a native oxide layer that is formed after cleaning the nitride layer, there is a problem in that the dielectric layer consisting of $Ta_2O_5$ will not be properly deposited.

On the other hand, even though the tantalum oxide layer is deposited on a semiconductor substrate via a chemical vapor deposition, oxygen vacancy appears in the dielectric layer. Therefore, an $UV-O_3$ treatment is typically performed to compensate for the oxygen vacancy during the chemical vapor deposition. Furthermore, the tantalum oxide layer is crystallized under an oxygen atmosphere by a heat treatment to increase the dielectric constant after performing the deposition.

When the tantalum oxide layer is performed the heat treatment under the oxygen atmosphere during the deposition or after the deposition, a storage electrode is also oxidized by a reaction with oxygen. The generation of the oxide layer increases the thickness of the dielectric layer of the capacitor, thereby reducing the capacitance of the capacitor of the semiconductor memory cell.

U.S. Pat. No. 5,316,982 issued to Taniguchi, et al. on May 31, 1994 discloses a capacitor of a semiconductor device having a lower electrode comprised of a Si-containing material, an aluminum oxide film formed on the surface of the lower electrode, a dielectric film of $Ta_2O_5$ formed on the aluminum oxide film, and an upper electrode on the dielectric film. According to Taniguchi, the aluminum oxide film is used for preventing a silicon oxide film from being formed on an interface between the poly-silicon film and the dielectric film of $Ta_2O_5$. This purportedly improves leakage current characteristics of the dielectric film of $Ta_2O_5$. The aluminum oxide film or aluminum film is deposited on the lower electrode via a plasma chemical vapor deposition, a thermal chemical vapor deposition, or a sputtering and then a heat treatment is performed thereon under non-oxygen atmosphere.

In performing the heat treatment of the aluminum oxide film under the non-oxygen ambient, the aluminum oxide film or the aluminum film is oxidized by oxygen supplied from a natural oxide film on the silicon, resulting in decreasing the oxidation of the silicon.

However, since the aluminum oxide film is subjected to the heat treatment under the non-oxygen ambient, a supplied amount of oxygen is insufficient. Accordingly, there is a problem in that a crystal structure of $Al_2O_3$ is unstable, causing poor leakage current characteristics.

SUMMARY OF THE INVENTION

A method of forming a capacitor of an integrated circuit device is provided, the capacitor including a lower electrode, an upper electrode, and a dielectric layer therebetween, which includes the steps of: a) adsorbing a metal compound on the lower electrode by using a gaseous metal compound; b) purging a physisorbed metal compound on the lower electrode by using an inert gas; c) oxidizing the metal compound adsorbed on the lower electrode with an oxidation gas to form a metal oxide; d) purging a gaseous product formed by oxidizing the metal compound; e) repeating the steps a) to d) to form a diffusion barrier layer of the metal oxide; f) forming the dielectric layer comprised of $Ta_2O_5$ on the diffusion barrier layer; and g) performing a heat treatment for the dielectric layer comprised of $Ta_2O_5$ under oxidation atmosphere. The steps are performed in a single atomic layer deposition chamber. The metal compound gas is trimethyl aluminum or triethyl aluminum. The metal oxide is $Al_2O_3$.

According to an embodiment of the present invention, the method of forming a capacitor of an integrated circuit device further includes the step of treating the diffusion barrier layer with $UV-O_3$. The oxidation gas is selected from the group consisting of $H_2O$, $O_3$, $O_2$ plasma, $N_2O$, and their mixtures. A thickness of the diffusion barrier layer is less than about 40 Å. A thickness of the dielectric layer is less than about 60 Å. A thickness of the dielectric layer is about 25 Å of an equivalent thickness of a silicon oxide layer. The capacitor is a cell capacitor of a dynamic random access memory. The lower electrode is a polysilicon layer.

A method of forming a capacitor of an integrated circuit device is also provided, the capacitor including a lower electrode, an upper electrode, and a dielectric layer therebetween, which inlcudes the steps of: a) preparing a wafer on which the lower electrode is formed in a reaction chamber; b) providing a gaseous metal compound to the reaction chamber for adsorbing the metal compound on a surface of the lower electrode of the wafer; c) purging a physisorbed metal compound on the surface of the lower electrode by using an inert gas; d) repeating the steps b) to c) for forming a metal compound layer; e) oxidizing the metal compound layer under oxidation atmosphere for forming a diffusion barrier layer comprised of a metal oxide; f) forming the dielectric layer comprised of $Ta_2O_5$ on the diffusion barrier layer; and g) performing a heat treatment for the dielectric layer comprised of $Ta_2O_5$ under an oxidation ambient. The step of e) is performed under an $UV-O_3$ atmosphere.

A method of forming a dielectric layer of an integrated circuit device in a reaction chamber is also provided, which includes the steps of: a) supplying a gaseous metal reactant to the reaction chamber, the reaction chamber including a substrate; b) removing a physisorbed metal reactant from the substrate; c) oxidizing the substrate having a chemisorbed metal reactant with an oxidizing agent for forming a metal oxide layer; d) removing gaseous products produced by oxidizing the substrate; and e) forming the dielectric layer on the metal oxide layer. The steps a) to d) are repeated until the metal oxide layer has a predetermined thickness.

According to an embodiment of the present invention, the predetermined thickness of the metal oxide layer is about 40 Å. The metal oxide layer is an aluminum oxide layer and the dielectric layer is a tantalum oxide layer. A thickness of the dielectric layer is about 25 Å of an equivalent thickness of a silicon oxide layer.

According to an embodiment of the present invention, the method further includes the step of treating the dielectric layer with $UV-O_3$ and further includes the step of heat treatment the dielectric layer. The gaseous metal reactant is trimethyl aluminum or triethyl aluminum. The oxidizing agent is selected from the group consisting of $H_2O$, $O_3$, $O_2$ plasma, $N_2O$, and their mixtures.

BRIEF DESCRIPTION OF THE DRAWINGS

The above and other objects and advantages of the present invention will become readily apparent by reference to the following detailed description when considered in conjunction with the accompanying drawings wherein:

FIG. 9 is a table illustrating an equivalent thickness of the dielectric layer in accordance with the present invention converted in a thickness of a silicon oxide layer;

DESCRIPTION OF PREFERRED EMBODIMENTS

Hereinafter, preferred embodiments of the present invention will be described in detail with reference to the accompanying drawings.

An atomic layer deposition method is for forming a thin film on a semiconductor substrate by chemisorption and desorption. Respective reaction materials are separately supplied to a reaction chamber in a pulse state so as to be adsorbed and desorbed on/from a surface of the semiconductor substrate by reacting the reaction materials with each other and being saturated on the surface of the semiconductor substrate.

The atomic layer deposition method has advantages in that it is easy to precisely control a composition of the thin film in comparison with a conventional chemical vapor deposition and particles are hardly generated. Therefore, it is possible to deposit a uniform thin film on the semiconductor substrate having a wider area. Furthermore, The atomic layer deposition technique does not generate impurities in the thin film and a step coverage thereof is excellent.

Figure 1:
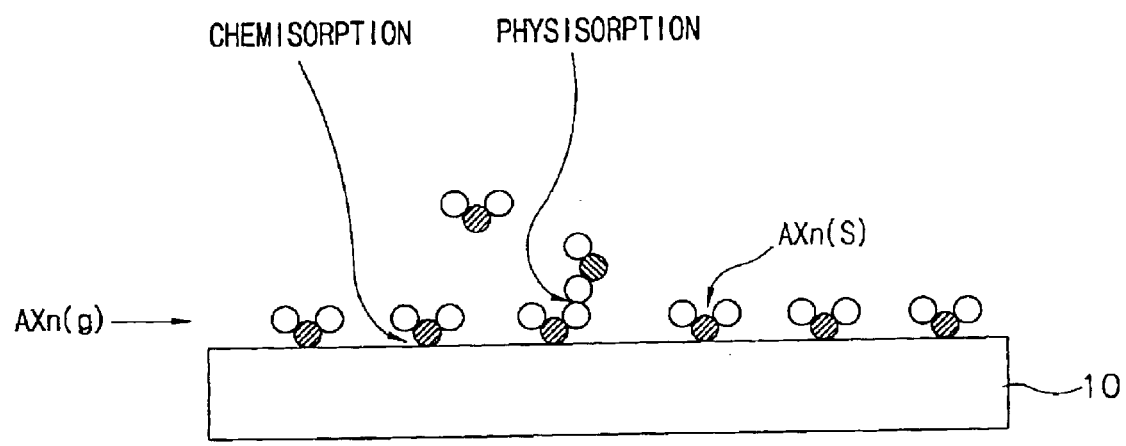
FIGS. 1 to 4 illustrate process steps for forming a dielectric layer using an atomic layer deposition method.

FIGS. 1 to 4 are process for forming a dielectric layer by using an atomic layer deposition method. Referring to FIG. 1, gaseous reactant $AXn(g)$ is supplied to a surface of a substrate 10 to form a thin film. The reactant $AXn(g)$ is adsorbed on the surface of the substrate 10 by a physisorption process and deposited on the surface of the substrate 10 to form $AXn(s)$ with a solid state by a chemisorption process.

Figure 2:
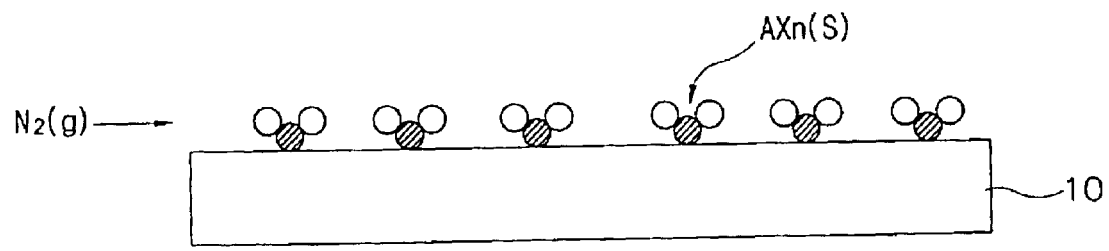

Referring to FIG. 2, when gaseous $N_2(g)$ is purged, the physisorbed reactant AXn on the substrate 10 is removed and the chemisorbed $AXn(s)$ remains on the substrate 10. Accordingly, the single atomic layer having a desired thickness is formed on the substrate 10. Herein, Xn denotes a chemical ligand having n numbers and A denotes, for example, a metal.

Figure 3:
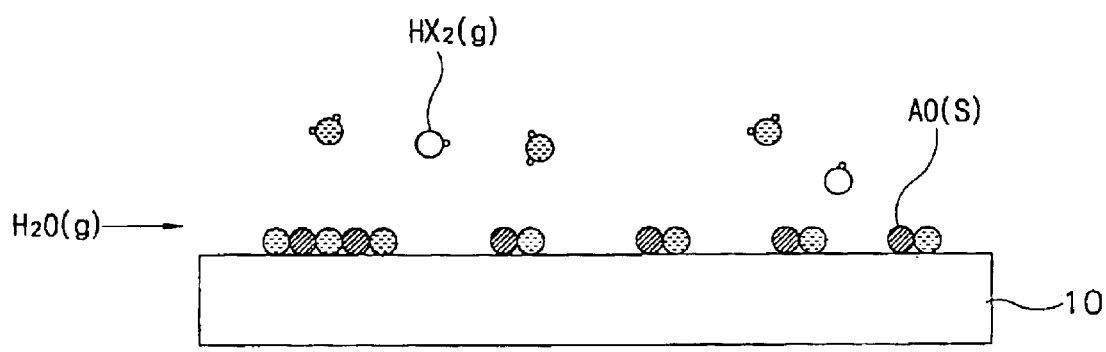

Referring to FIG. 3, when vapor such as $H_2O(g)$ is provided to the surface of the substrate 10 having the chemisorbed $AXn(s)$, A is oxidized to form AO on the surface of the substrate and Xn is reacted with H to form gaseous $HXn(g)$, and then the gaseous $HXn(g)$ is generated.

Figure 4:
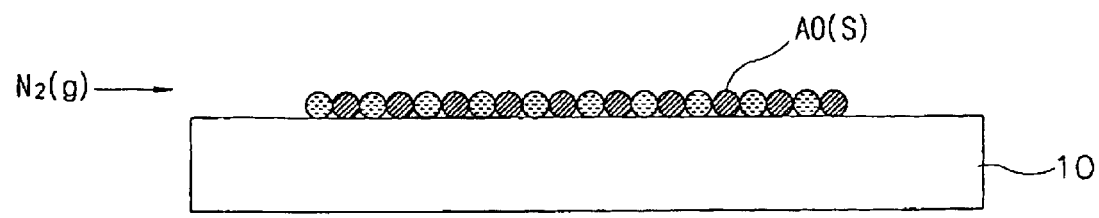

Referring to FIG. 4, when gaseous $N_2(g)$ is purged, the gaseous $HXn(g)$ and a remaining impurity is removed, and an oxide layer having a single atomic layer consisting of the chemisorbed AO(s) is formed with a desired thickness.

Figure 5:
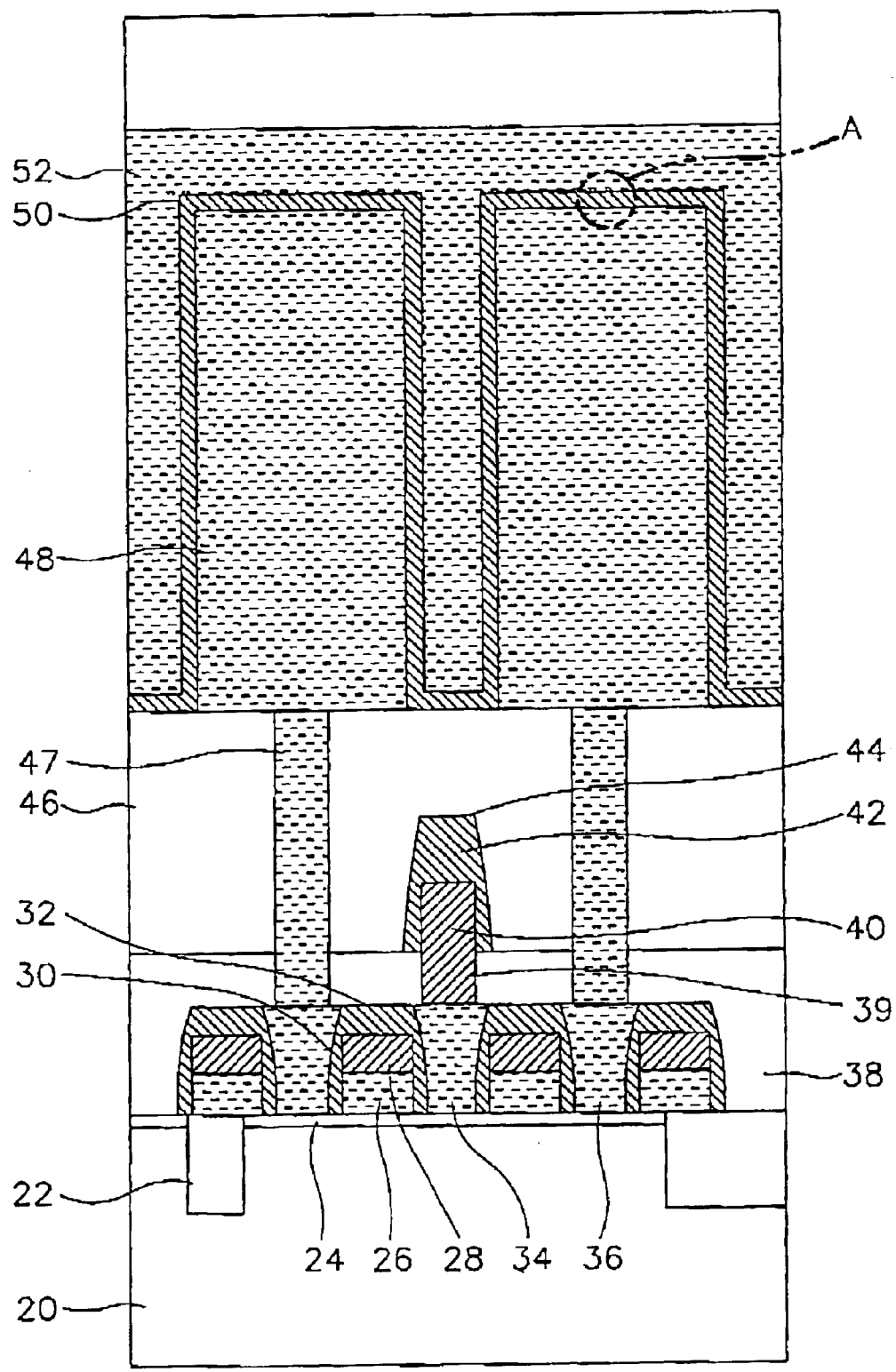
FIG. 5 is a cross-sectional view showing a dynamic random access memory device in which a dielectric layer is formed according to an embodiment of the present invention.

FIG. 5 is a cross-sectional view showing a DRAM device in which a dielectric layer is formed.

Referring to FIG. 5, the DRAM device includes a trench type field oxide layer 22 formed on a silicon substrate 20 to define an active area and active elements formed on the active area. Typically, the active elements are MOS transistors.

Each of the MOS transistors includes a gate electrode having a laminated structure in which polysilicon 26 and tungsten silicide 28 are laminated on a gate oxide layer 24. The gate electrode is protected by a sidewall spacer 30 and a mask layer 32 as insulators. The gate electrode is used as an ion implant mask when impurities are implanted in the active area at a surface portion of the silicon substrate 20 to form source and drain regions.

The DRAM device further includes first and second contact plugs 34 and 36 formed with conductive material such as polysilicon on the source and drain regions by a self-align contact technique using the gate electrodes as masks. The first and second contact plugs 34 and 36 are independently separated from each other. The first contact plug 34 is used as a drain contact plug and the second contact plug 36 is used as a source contact plug.

The DRAM device further includes a first insulation film 38 to cover the MOS transistors. The surface of the first insulation film 38 is planarized by a chemical and mechanical polishing process.

The DRAM device further includes a bit line contact formed in the first insulation film 38 and a bit line 40 on the bit line contact. The bit line contact is electrically connected to the first contact plug 34. The bit line 40 is protected by a sidewall spacer 42 and a mask layer 44 as insulating material.

The DRAM device further includes a second insulation film 46 covered on the first insulating film 38 having the bit line 40 and a buried contact 47 in the second insulating film 46. The surface of the second insulation film 46 is also planarized through a chemical and mechanical polishing process. The buried contact 47 is electrically connected to the second contact plug 36.

The DRAM device further includes a cell capacitor formed on the second insulation film 46. The cell capacitor includes a lower electrode layer 48 electrically connected to the buried contact 47 on the second insulation layer 46, a dielectric layer 50 formed on the lower electrode 48, and an upper electrode layer 52 covered the dielectric layer 50. The lower electrode layer 48 is preferably comprised of conductive material such as the polysilicon and has a cylindrical shape with an uneven surface such as hemisphere silicon grain to enlarge a surface area thereof and a height of about 5,000 Å to about 15,000 Å. The upper electrode layer 52 is formed of conductive material such as polysilicon.

Figure 6:
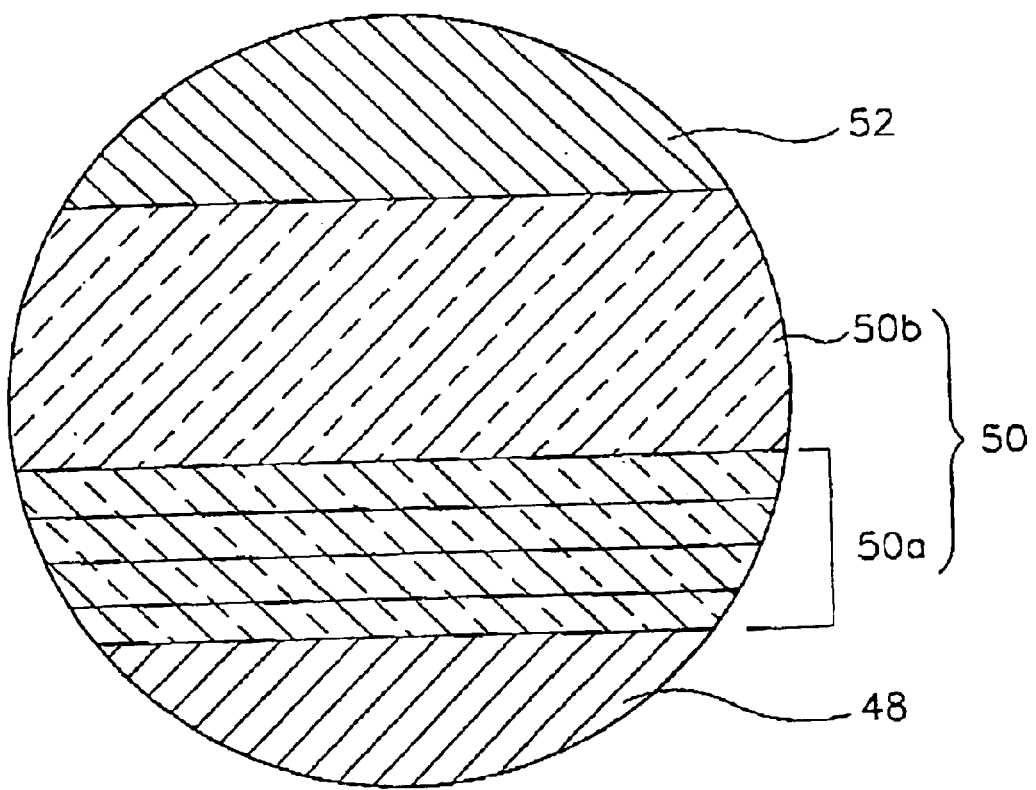
FIG. 6 is a partially enlarged view of the dynamic random access memory device, marked in a circle A of FIG. 5.

FIG. 6 is a partially enlarged view of the DRAM device, marked in a circle A in FIG. 5. Referring to FIG. 6, the dielectric layer 50 includes a diffusion barrier layer 50a comprising an atomic layer of $Al_2O_3$ having a thickness of about 40 Å, preferably about 30 Å, and a dielectric layer 50b comprising $Ta_2O_5$ having a thickness of about 60 Å, preferably about 50 Å.

Figure 7:
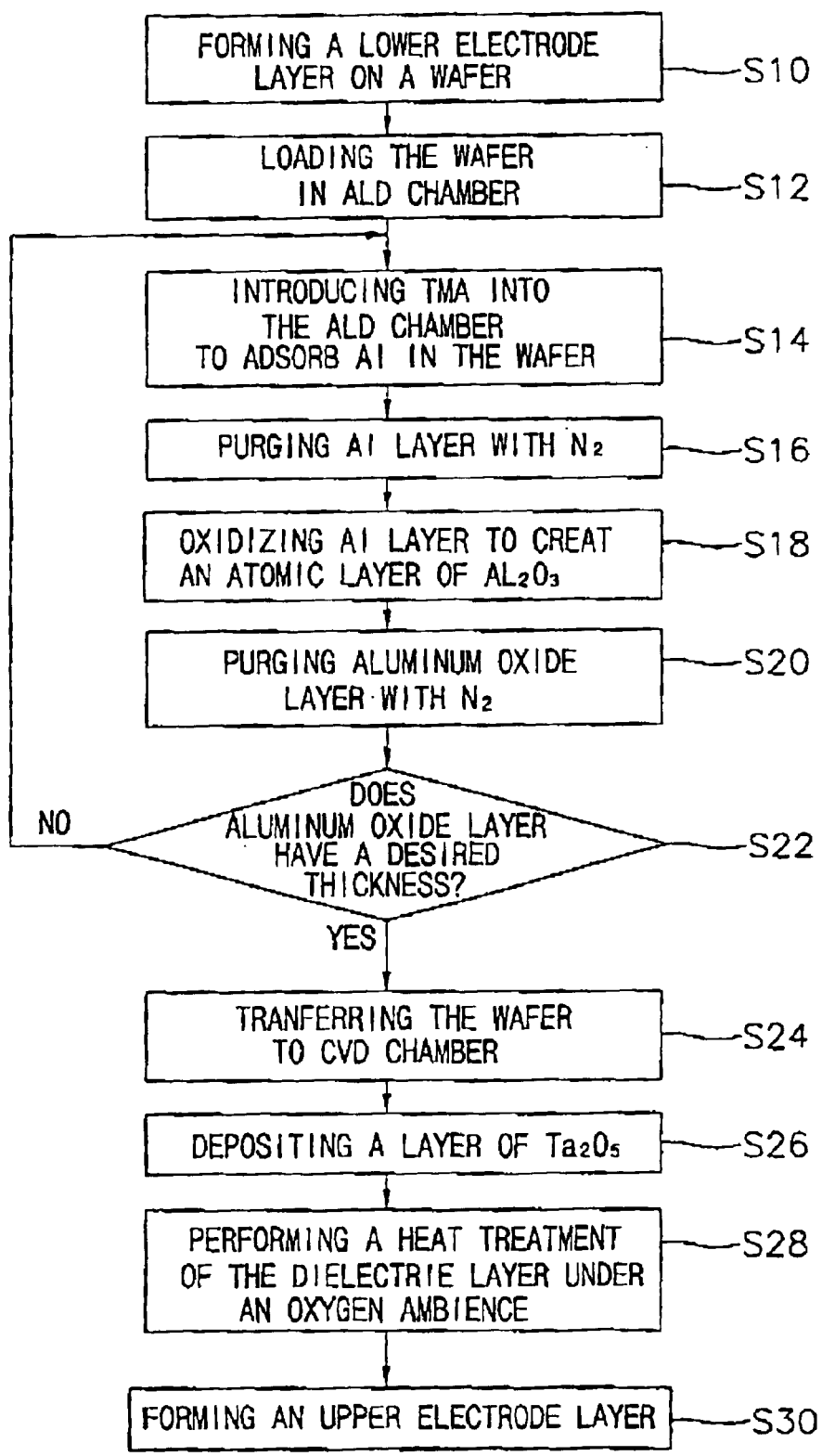
FIG. 7 is a flowchart illustrating a process of forming a capacitor having the dielectric layer according to an embodiment of the present invention.

FIG. 7 is a flowchart illustrating a process of forming a capacitor having the dielectric layer 50 according to an embodiment of the present invention.

First, a wafer having the lower electrode layer is prepared (step S10).

The wafer prepared at the step S10 is loaded into a reaction chamber for atomic layer deposition (step S12).

Gaseous metal compound such as trimethyl aluminum (TMA, $Al(CH_3)_3$) and triethyl aluminum (TEA, $Al(C_2H_5)_3$) as reaction gases is introduced into the reaction chamber so that TMA is adsorbed on the wafer (step S14). Note that the gaseous TMA is used as the gaseous metal compound for illustrating the advantages of the invention and one skilled in the art readily appreciates the other gaseous metal compound can be used.

Next, purge gas such as $N_2$ is provided into the reaction chamber to purge out a physisorbed TMA while allowing a chemisorbed TMA to remain on the surface of the wafer (step S16).

Figure 8:
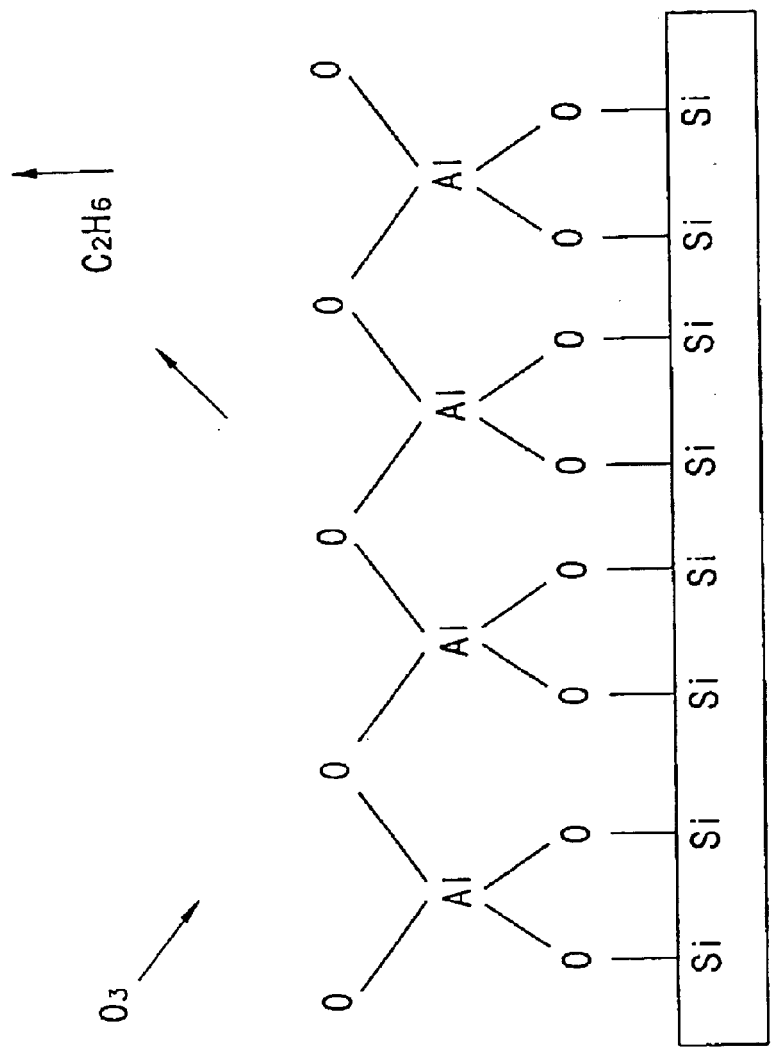
FIG. 8 is a structure of a single atomic layer of $Al_2O_3$ according to an embodiment of the present invention.

Next, oxidation gas such as $H_2O$, $O_3$, plasma $O_2$, $N_2O$, and their mixtures is supplied to the reaction chamber to oxidize the chemisorbed TMA so that an aluminum oxide film is formed and a byproduct $C_3H_6(g)$ is generated as shown in FIG. 8 by a following reaction (step S18).

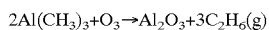

As a result, it is possible to minimize pollution in the aluminum oxide film.

Next, the reaction chamber having the wafer is purged with an inert gas such as $N_2$, Ar, and He to remove the byproduct $C_3H_6(g)$ as shown in FIG. 8 (step 20).

Next, the steps S14 to S20 are repeatedly performed in the reaction chamber to form the diffusion barrier layer having a thickness of about 20 Å (step S22).

Next, the wafer on which the diffusion barrier layer is formed is transferred to a chemical vapor deposition chamber (step 24) and a dielectric layer such as a $Ta_2O_5$ layer is deposited on the diffusion barrier layer to have a thickness of about 50 Å (step S26). During the deposition, the dielectric layer is treated with $UV-O_3$. The $UV-O_3$ treatment is typically performed to compensate the oxygen vacancy in the diffusion barrier layer during the chemical vapor deposition.

Next, a heat treatment is performed under oxygen atmosphere at temperature of about 750° C. for about 15 minutes to crystallize the dielectric layer (step S28). By the heat treatment under oxygen atmosphere, the dielectric layer is crystallized, thereby increasing a dielectric constant.

Next, polysilicon is deposited on the dielectric layer to form an upper electrode layer (step S30).

FIG. 9 is a table illustrating an equivalence thickness of the dielectric layer (TOXEQ) converted into a thickness of a silicon oxide layer. That is, according to the present invention, in the case of using the $Al_2O_3$ layer as the diffusion barrier layer for the dielectric layer comprising $Ta_2O_5$, the equivalence thickness of the dielectric layer is about 25 Å. Here, a thickness of a layer of $SiO_2$ in FIG. 9 denotes a natural oxide film formed on the surface of the lower electrode layer 48. In the case of using a conventional silicon nitride layer as a diffusion barrier layer, the thickness of the dielectric layer is about 36 Å. Thus, the thickness of the dielectric layer can be reduced to about 10 Å. Accordingly, a capacitance of the capacitor is increased by reducing the thickness of the dielectric layer. This result is accomplished by uniformly forming the diffusion barrier layer 50a formed of the aluminum oxide film by the atomic layer deposition method in which the thickness is precisely controlled.

Figure 10:
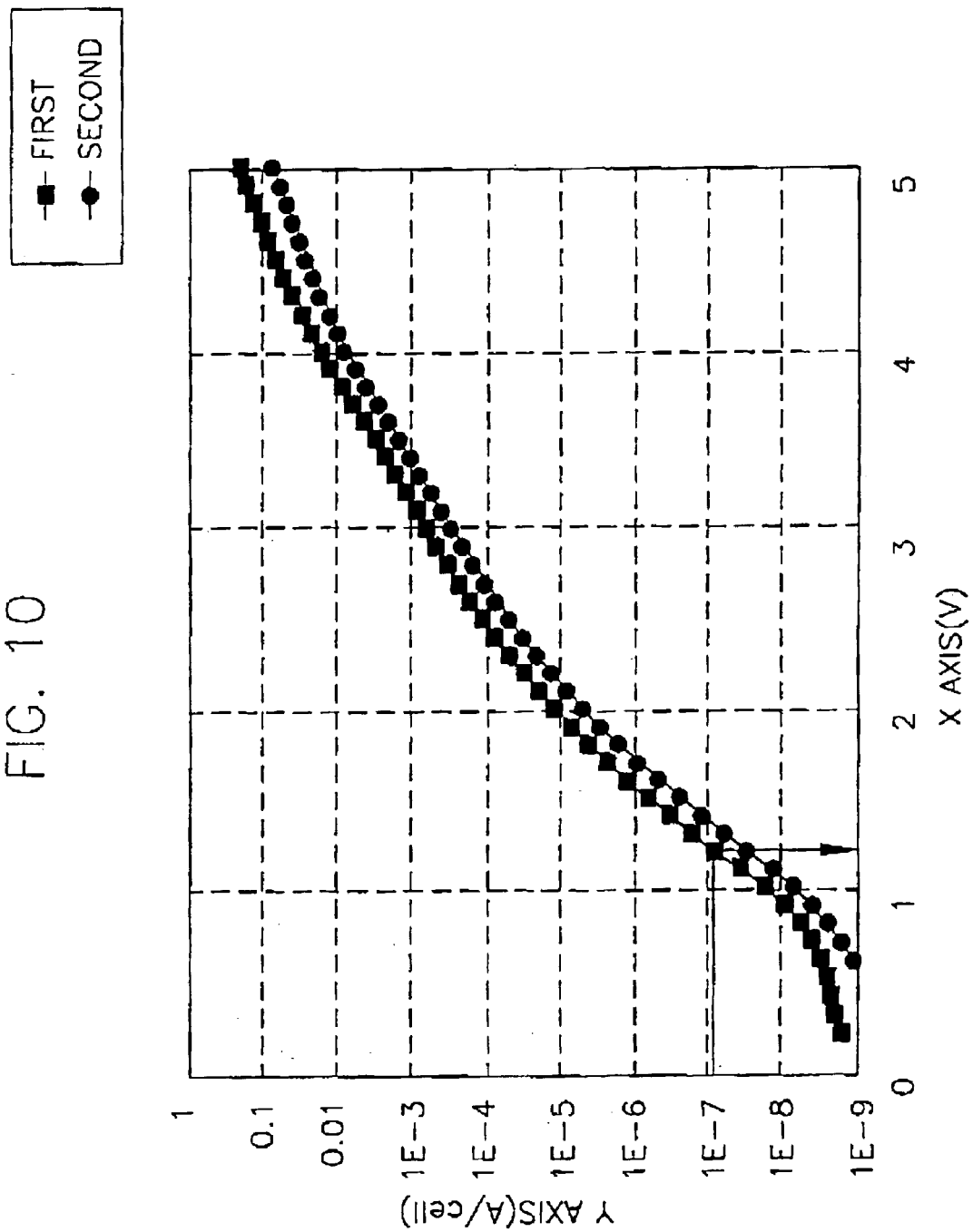
FIG. 10 is a graph illustrating characteristics of a leakage current when the single atomic layer of $Al_2O_3$ was not treated with $UV-O_3$ after depositing the single atomic layer of $Al_2O_3$.
Figure 11:
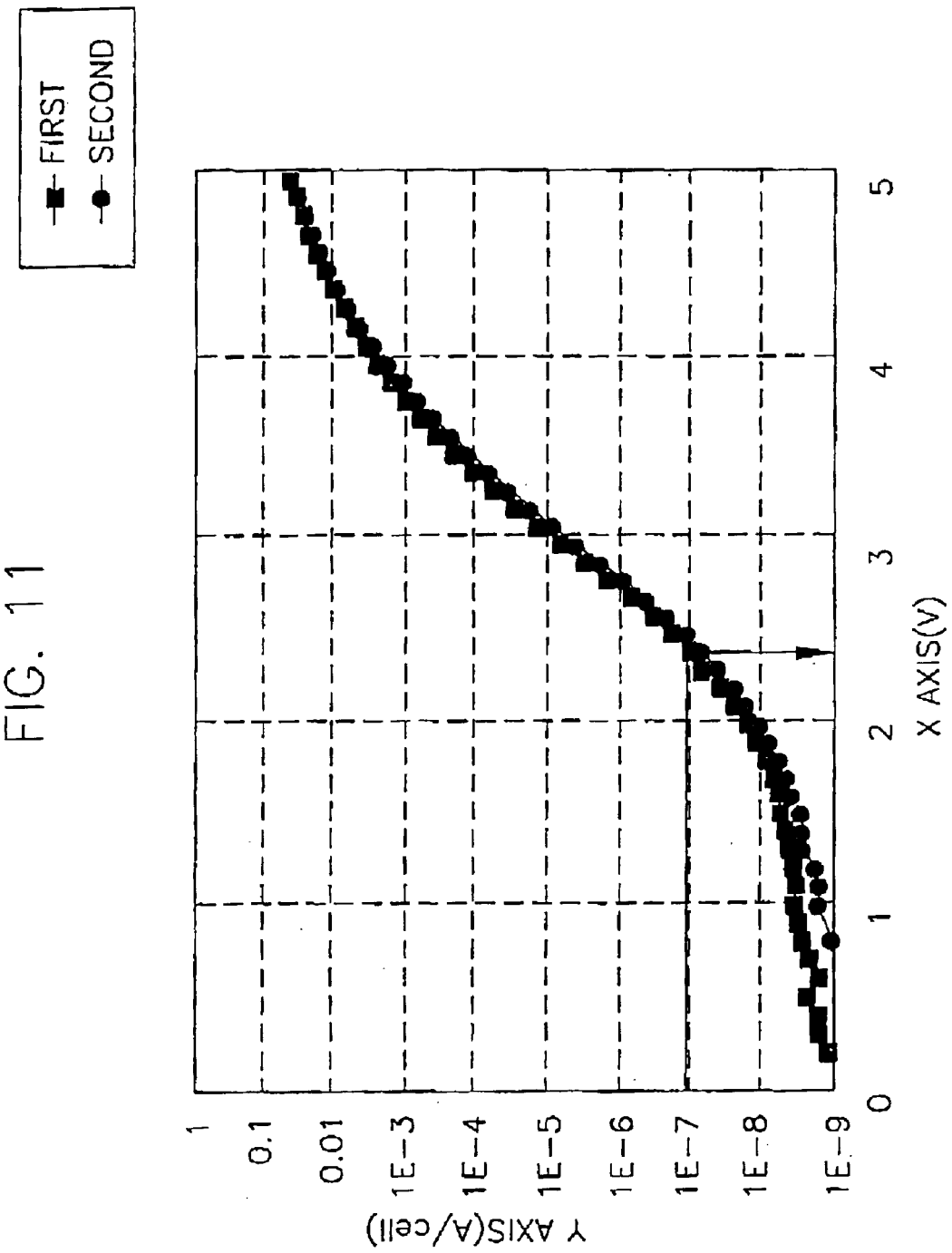
FIG. 11 is a graph illustrating characteristics of a leakage current when the single layer of $Al_2O_3$ was treated with $UV-O_3$ after depositing the single atomic layer of $Al_2O_3$ according to the present invention.

FIG. 10 is a graph illustrating characteristics of a leakage current when the diffusion barrier layer 51a formed of $Al_2O_3$ was not treated with $UV-O_3$ after depositing the diffusion barrier layer 51a and FIG. 11 is a graph illustrating characteristics of a leakage current when the diffusion barrier layer 51a formed of $Al_2O_3$ was treated with $UV-O_3$ after depositing the diffusion barrier layer 51a according to the present invention.

As shown in FIGS. 10 and 11, when the diffusion barrier layer 51a formed of $Al_2O_3$ was not treated with $UV-O_3$, a take-off voltage (less than 1 fA/cell leakage current) was 1.2V, and when the diffusion barrier layer 51a formed of $Al_2O_3$ was treated with $UV-O_3$, a take-off voltage (less than 1 fA/cell leakage current) was 2.4V. Thus, when the diffusion barrier layer 51a formed of $Al_2O_3$ was treated with $UV-O_3$, the leakage current characteristic was improved. In the present invention, as described above, when the layer of $Al_2O_3$ is formed as the diffusion barrier layer in the case of using the dielectric layer of $Ta_2O_5$ having a high dielectric constant and the low leakage current characteristics, the layer of $Al_2O_3$ is uniformly deposited at a low temperature by using the atomic layer deposition method, thereby stably forming the dielectric layer of $Ta_2O_5$ on the diffusion barrier layer. Furthermore, as the layer of $Al_2O_3$ is deposited under an oxygen ambient or the layer of $Al_2O_3$ is treated with $UV-O_3$ after depositing the layer of $Al_2O_3$, the characteristic of the leakage current of the $Al_2O_3$ layer is improved, resulting in improving the reliability of the dielectric film.

Although preferred embodiments of the present invention have been described, it is understood that the present inven-

What is claimed is:

1. A method of forming a capacitor of an integrated circuit device, the capacitor comprising a lower electrode, an upper electrode, and a dielectric stack therebetween, comprising the steps of:
   a) adsorbing a metal compound on the lower electrode by using a gaseous metal compound;
   b) purging a physisorbed metal compound on the lower electrode by using an inert gas;
   c) oxidizing the metal compound adsorbed on the lower electrode to form a metal oxide;
   d) purging a gaseous product formed by oxidizing the metal compound;
   e) repeating the steps a) to d) to form a diffusion barrier layer of the metal oxide;
   f) performing a UV-O3 treatment on the diffusion barrier layer;
   g) forming a dielectric layer comprised of $Ta_2O_5$ on the diffusion barrier layer; and
   h) performing a heat treatment for the dielectric layer comprised of $Ta_2O_5$ in an oxygen atmosphere,
   wherein the dielectric stack comprising the diffusion barrier layer and the dielectric layer formed on a surface of the lower electrode has an equivalent silicon oxide layer thickness of about 25 Å.

2. A method of forming a capacitor of an integrated circuit device as claimed in claim 1, wherein the steps a) to e) are performed in a single atomic layer deposition chamber.

3. A method of forming a capacitor of an integrated circuit device as claimed in claim 1, wherein the metal compound gas is trimethyl aluminum or triethyl aluminum.

4. A method of forming a capacitor of an integrated circuit device as claimed in claim 1, wherein the metal oxide is $Al_2O_3$.

5. A method of forming a capacitor of an integrated circuit device as claimed in claim 1, wherein oxidizing the metal compound is performed using an oxygen gas selected from the group consisting of $H_2O$, $O_3$, $O_2$ plasma, $N_2O$, and their mixtures.

6. A method of forming a capacitor of an integrated circuit device as claimed in claim 1, wherein a thickness of the diffusion barrier layer is less than about 30 Å.

7. A method of forming a capacitor of an integrated circuit device as claimed in claim 1, wherein a thickness of the dielectric layer is less than about 50 Å.

8. A method of forming a capacitor of an integrated circuit device as claimed in claim 1, wherein the capacitor is a cell capacitor of a dynamic random access memory.

9. A method of forming a capacitor of an integrated circuit device as claimed in claim 1, wherein the lower electrode is a polysilicon layer.

10. A method of forming a capacitor of an integrated circuit device, the capacitor comprising a lower electrode, an upper electrode, and a dielectric stack therebetween, comprising the steps of:
    a) preparing a wafer on which the lower electrode is formed in a reaction chamber;
    b) providing a gaseous metal compound to the reaction chamber for adsorbing the metal compound on a surface of the lower electrode of the wafer;
    c) purging a physisorbed metal compound on the surface of the lower electrode by using an insert gas;
    d) repeating the steps b) to c) for forming a metal compound layer;
    e) oxidizing the metal compound layer for forming a diffusion barrier layer of a metal oxide;
    f) performing a UV-O3 treatment on the diffusion barrier layers
    g) forming a dielectric layer comprised of $Ta_2O_5$ on the diffusion barrier layer; and
    h) performing a heat treatment for the dielectric layer comprised of $Ta_2O_5$ in an oxygen atmosphere,
    wherein the dielectric stack comprising the diffusion barrier layer and the dielectric layer formed on a surface of the lower electrode has an equivalent silicon oxide layer thickness of about 25 Å.

11. A method of forming a dielectric stack of an integrated circuit device in a reaction chamber, comprising the steps of:
    a) supplying a gaseous metal reactant to the reaction chamber, the reaction chamber including a substrate;
    b) removing a physisorbed metal reactant from the substrate;
    c) oxidizing the substrate having a chemisorbed metal reactant with an oxidizing agent for forming a diffusion barrier layer;
    d) removing gaseous products produced by oxidizing the substrate;
    e) performing a UV-O3 treatment on the diffusion barrier layer; and
    f) forming a dielectric layer on the diffusion barrier layer,
    wherein the dielectric stack comprising the diffusion barrier layer and the dielectric layer formed on a surface of the lower electrode has an equivalent silicon oxide layer thickness of about 25 Å.

12. A method as claimed in claim 11, wherein the steps a) to d) are repeated until the diffusion barrier layer has a predetermined thickness.

13. A method as claimed in claim 12, wherein the predetermined thickness of the diffusion barrier layer is about 20 Å.

14. A method as claimed in claim 11, wherein the diffusion barrier layer is an aluminum oxide layer and the dielectric layer is a tantalum oxide layer.

15. A method as claimed in claim 14, further comprising the step of treating the dielectric layer with UV-O3.

16. A method as claimed in claim 14, further comprising the step of heat treatment of the dielectric layer.

17. A method as claimed in claim 11, wherein the gaseous metal reactant is trimethyl aluminum or triethyl aluminum.

18. A method as claimed in claim 11, wherein the oxidizing agent is selected from the group consisting of $H_2O$, $O_3$, $O_2$ plasma, $N_2O$, and their mixtures.

* * * * *